(12) United States Patent
Chen

(10) Patent No.: US 8,487,654 B1
(45) Date of Patent: Jul. 16, 2013

(54) VOLTAGE MODE DRIVER WITH CURRENT BOOSTER (VMDCB)

(75) Inventor: Wei Chih Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/408,196

(22) Filed: Feb. 29, 2012

(51) Int. Cl.
*H03K 19/094* (2006.01)
*H03K 19/0175* (2006.01)

(52) U.S. Cl.
USPC .............. 326/83; 326/82; 326/87; 327/112; 327/387

(58) Field of Classification Search
USPC ............ 326/26, 27, 82, 83, 86, 87; 327/112, 327/387
See application file for complete search history.

(56) References Cited

U.S. PATENT DOCUMENTS

| | | | | |
|---|---|---|---|---|
| 5,220,216 A | * | 6/1993 | Woo | 326/50 |
| 6,147,513 A | * | 11/2000 | Bui | 326/83 |
| 6,704,818 B1 | * | 3/2004 | Martin et al. | 710/100 |
| 7,236,013 B2 | * | 6/2007 | Kasanyal et al. | 326/83 |

\* cited by examiner

*Primary Examiner* — Daniel D Chang
(74) *Attorney, Agent, or Firm* — Duane Morris LLP

(57) ABSTRACT

A voltage mode driver circuit able to achieve a larger voltage output swing than its supply voltage. The voltage mode driver circuit is supplemented by a current source or "current booster." The circuit includes a first inverter, a second inverter, and a current source. The first inverter receives a first input and output a signal at anode. The second inverter receives another input outputs at the same output node. The current source is serially coupled to the output node via a first switch, the first switch receiving an input at the first input.

20 Claims, 5 Drawing Sheets

VOLTAGE MODE DRIVER WITH CURRENT BOOSTER (VMDCB)

BACKGROUND

1. Technical Field

Aspects of the present disclosure relate in general to electronic circuitry. In particular, aspects of the disclosure include a Voltage Mode Driver with Current Booster (VMDCB) able to achieve a larger voltage output swing than its supply voltage.

2. Description of the Related Art

The output swing of a conventional Voltage Mode Driver (VMD) structure is limited by the power supply of the circuit. For example, a circuit with a one volt (1 V) power supply can produce a one volt differential peak-to-peak (1 $V_{DIFFPP}$) swing.

However, as semiconductor fabrication processes shrink device sizes smaller and smaller, the supply voltage is typically decreased as well. Consequently, it is difficult to achieve 1 $V_{DIFFPP}$ when supply voltage is less than 1V.

There are several approaches used in the prior art to address this issue.

One approach is to raise the supply voltage. However, raising the supply voltage to overdrive a device often results in a device reliability issue.

Another approach is to adjust the termination to produce a large divided voltage on the receiver side. However, such a change would cause an impedance mismatch, and result in poor signal integrity.

A conventional (PRIOR ART) voltage mode driver (VMD) system 1000 is shown in FIG. 1. Voltage Mode Driver 1100 comprises a pair of p-type transistors 1102, 1106 coupled to n-type transistors 1104, 1108, driving positive output node TXP and negative output node TXN via a supply voltage AVTTR, respectively. The receiver nodes (positive reception node RXP and negative reception node RXN) are modeled as capacitors 1202, 1206 serially connected to resistors 1204, 1208. Assuming the termination is 50 ohms, the receiver's signal amplitude will be AVTTR/4. For example, 1V of AVTTR can produce 0.25V amplitude—which is 1V of $V_{DIFFPP}$ swing.

However, as semiconductor processes shrink, supply voltage sizes are also shrunk. In current state of the art processes, the supply voltage is often below 1V. Consequently, it is difficult to achieve 1V $V_{DIFFPP}$.

When the supply voltages are raised to obtain a higher $V_{DIFFPP}$ output swing, the device reliability is a concern, as the transistors are overstressed.

SUMMARY

A voltage mode driver circuit is able to achieve a larger voltage output swing than its supply voltage. The voltage mode driver circuit is supplemented by a current source or "current booster." The circuit includes a first inverter, a second inverter, and a current source. The first inverter receives a first input and output a signal at a node. The second inverter receives a second input, and outputs at the same output node. The current source is serially coupled to the output node via a first switch, the first switch receiving an input at the first input.

In another embodiment, a voltage mode driver circuit includes a first p-type transistor, a first n-type transistor, a first current source, and a second current source. The first p-type transistor has a first p-type gate, a first p-type source and a first p-type drain. The first p-type gate is connected to receive a first input; the first p-type source is connected to a power supply; the first p-type drain is serially coupled with an output node TXP via a first resistance. The first n-type transistor has a first n-type gate, a first n-type source and a first n-type drain. The first n-type gate is connected to receive the first input. The first n-type source is connected to ground. The first n-type drain is serially coupled with the output node TXP via a second resistance. The first current source is serially coupled between the power supply and the node TXP via a first switch. The second current source is serially coupled between ground and to the node TXP via a second switch.

DETAILED DESCRIPTION

Figure 1:
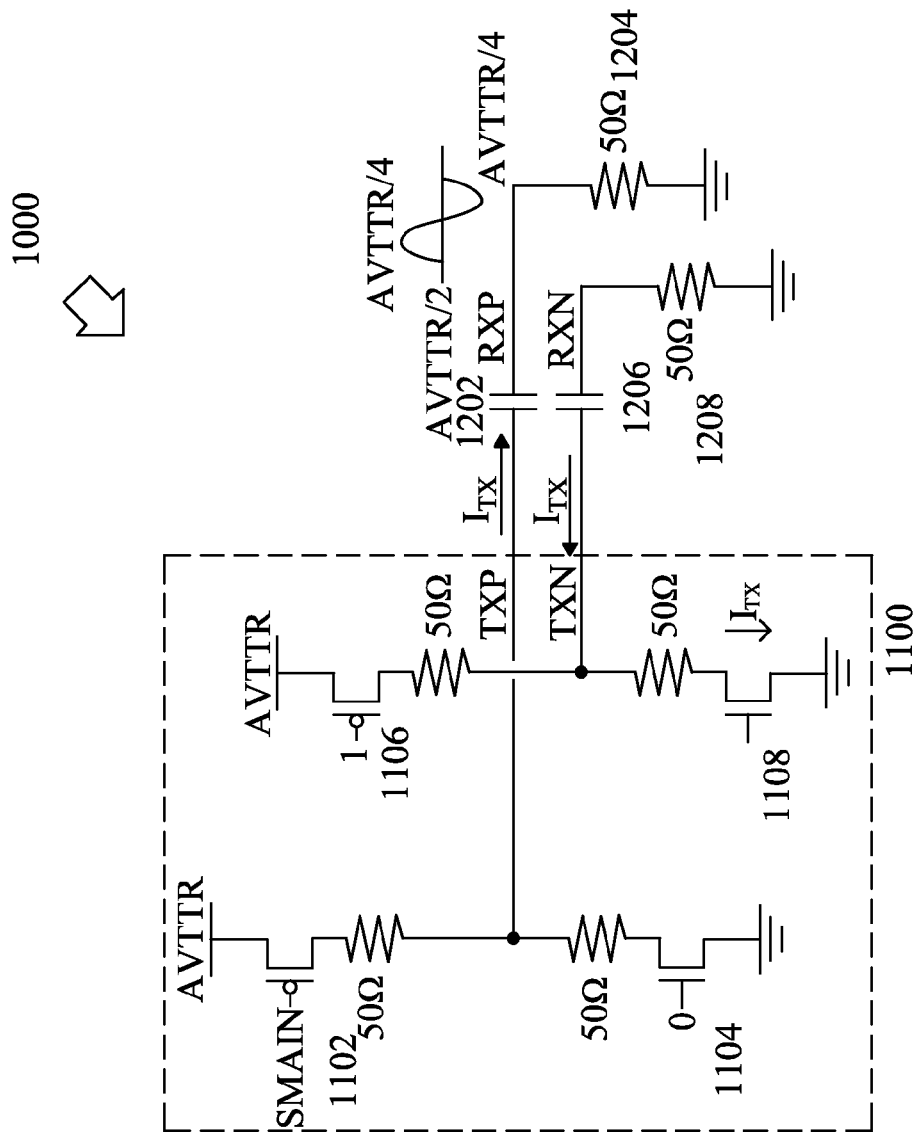
FIG. 1 depicts a conventional Voltage Mode Driver (VMD) structure of the PRIOR ART.

One aspect of the present disclosure includes a voltage mode driver with a current source to boost output swing. Impedance matching with output receivers may be accomplished through the use of high-resistance current sources.

In another aspect, the control is synchronized between the voltage mode driver and current source, ignoring any resulting skew.

Embodiments overcome a lower output voltage swing, and overcome the lower output swing due to headroom decrease in advanced semiconductor processes. This results in lower power consumption and a smaller die-size area.

In embodiments of the current disclosure, the output voltage swing is somewhat independent of the supply voltage, and instead may be adjusted by the current ratio of parallel current sources.

Embodiments are compatible with any semiconductor process and lower supply voltages. Embodiments with proper impedance matching may result in good output signal integrity, and are more reliable than the prior art.

The following embodiments are described in a plurality of sections. Further, circuit elements making up each of functional blocks of the following embodiments are formed on a semiconductor substrate made of a single crystal silicon by use of the known integrated circuit (IC) technology for Complementary Metal Oxide Semiconductors (CMOS) transistors. With the present embodiments, a MOSFET (Metal Oxide Semiconductor Field Effect Transistor) (abbreviated to MOS transistor) is used as an example of a Metal Insulator Semiconductor Field. Effect Transistor (MISFET). However, a non-oxide film is not precluded as a gate insulating film. In the drawings, a symbol 0 is affixed to a p-channel MOS transistor (PMOS transistor or "p-type" transistor) to be thereby differentiated from an n-channel MOS transistor (NMOS transistor or "p-type" transistor). Further, in the drawings, connection of a substrate potential of a MOS transistor is not specifically shown, however, there is no particular limitation to a connection method thereof if the MOS transistor is present in a normally operable range.

Embodiments of the invention will be described hereinafter with reference to the drawings. In all the drawings for use describing the embodiments, identical members are in principle denoted by like reference numerals, thereby omitting detailed description thereof.

Figure 2:
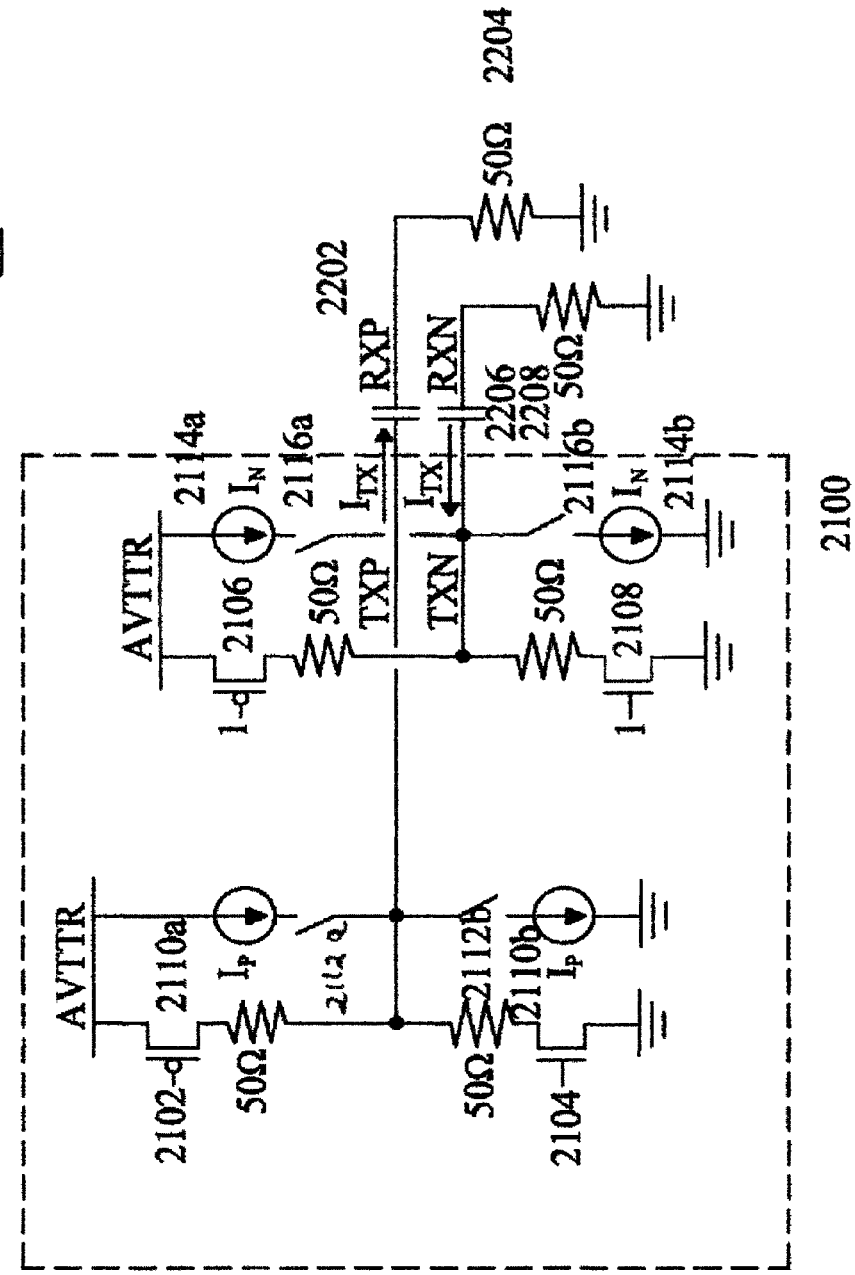
FIG. 2 describes a model of Voltage Mode Driver with Current Booster (VMDCB) circuit.

Let us now turn to an embodiment of a voltage mode divider circuit 2000, shown in FIG. 2. FIG. 2 illustrates an embodiment of a Voltage Mode Driver with current booster 2100, constructed and operative in accordance with an embodiment of the current disclosure. As shown in FIG. 2, Voltage Mode Driver 2100 drives positive output node TXP and negative output node TXN via a supply voltage AVTTR. The receiver nodes (positive reception node RXP and negative reception node RXN) are modeled as capacitors 2202, 2206 serially connected to resistors 2204, 2208.

Voltage Mode Driver 2100 comprises two paths for generating the positive and negative output nodes. We shall refer to these nodes as positive output node TXP and negative output node TXN.

The voltage of positive output node TXP is governed by an inverter with p-type transistor 2102 coupled through resistors to n-type transistor 2104. In parallel to this pair of transistors are current sources 2110a-b linked with switches 2112a-b. Node TXP may driven by a power source (labeled AVTTR) serially connected with current source $I_P$ 2110a and switch 2112a, current source $I_P$ 2110a and switch 2112a connected to ground, and power source AVTTR serially connected with current source $I_N$ 2114a and switch 2116a.

Similarly, the voltage of negative output node TXN is governed by an inverter with p-type transistor 2106 coupled to n-type transistor 2108; this transistor pair is further driven by a voltage source linked current source $I_N$ 2114b and switch 2116b connected to ground. It is understood by those known in the art that transistors 2106 and 2108 receive an opposite signal from transistors 2102 and 2104.

In this embodiment, current sources $I_P$ 2110a-b and $I_N$ 2114a-b are controllable and may adjust to power supply AVTTR voltage changes. Control of switches 2112a-b, 2216a-b is synchronous with Voltage Mode Divider's 2100 input signal. It is understood by those practicing the art that switches 2112a-b, 2216a-b may be metal-oxide-semiconductor (MOS) switches or any other switches known in the art.

Resisters may be used for impedance matching. In FIG. 2, 50 ohm terminations are shown for each output terminal.

Figure 3:
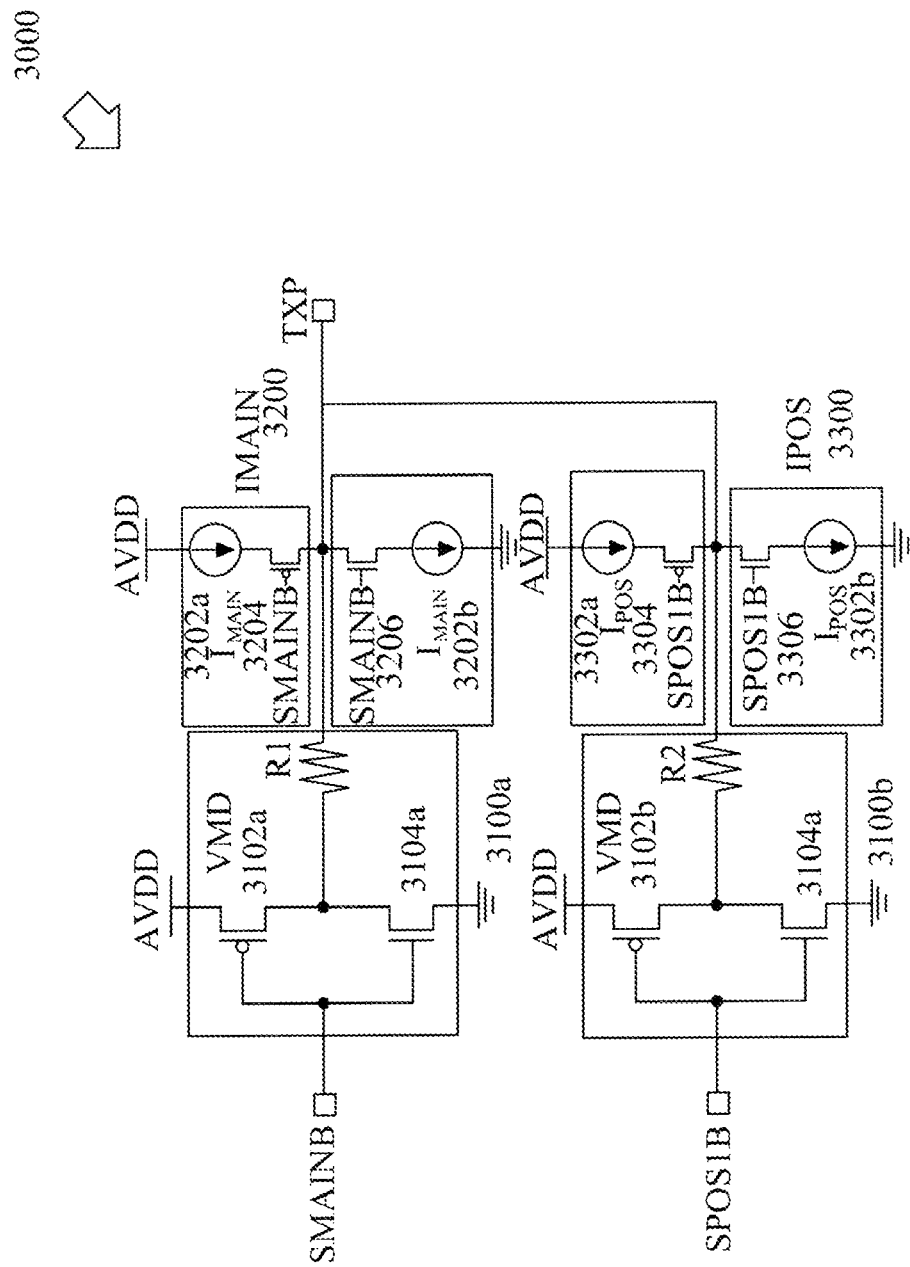
FIG. 3 is the embodiment of a Voltage Mode Driver with Current Booster (VMDCB).

Moving to FIG. 3, an alternate embodiment of a Voltage Mode Driver with Current Booster is depicted, constructed and operative in accordance with an embodiment of the current disclosure. In this second embodiment, Voltage Mode Driver 3000 has a single positive output node TXP, and receives opposite inputs SMAINB and SPOS1B; Voltage Mode Driver 3000 is further powered by voltage supply AVDD. The inputs SMAIN and SMAINB are received from a previous buffer chain. Voltage Mode Driver 3000 comprises a pair of impedance matched inverters 3100a-b, in parallel with switched current sources IMAIN 3200 and IPOS 3100.

Inverter 3100a receives input SMAINB, while inverter 3100b receives input SPOS1B. Each inverter 3100 comprises a p-type transistor 3102 coupled to n-type transistor 3104 powered by voltage source AVDD. The gates of each transistor 3102 are connected with the appropriate input, as shown in FIG. 3. The inverter output TXP is impedance matched (using a resistance R) with an expected receiver.

In addition to the two parallel inverters, TXP is driven with a pair of switched current sources IMAIN 3200 and IPOS 3300. Current sources IMAIN 3200 and IPOS 3100 are used to either "pull-up" or "pull-down" the output voltage.

IMAIN 3200 comprises two current sources Imain 3202a-b controlled by switches 3204 3206. Switches 3204 3206 receives input from signal SMAINB. Switch 3204 may be a p-type transistor, while switch 3206 may be an n-type transistor.

Similarly, IPOS 3300 comprises two current sources Ipos 3302a-b controlled by switches 3304 3306. Switches 3304 3306 receives input from signal SPOS1B. Switch 3304 may be a p-type transistor, while switch 3306 may be an n-type transistor.

Figure 4A:
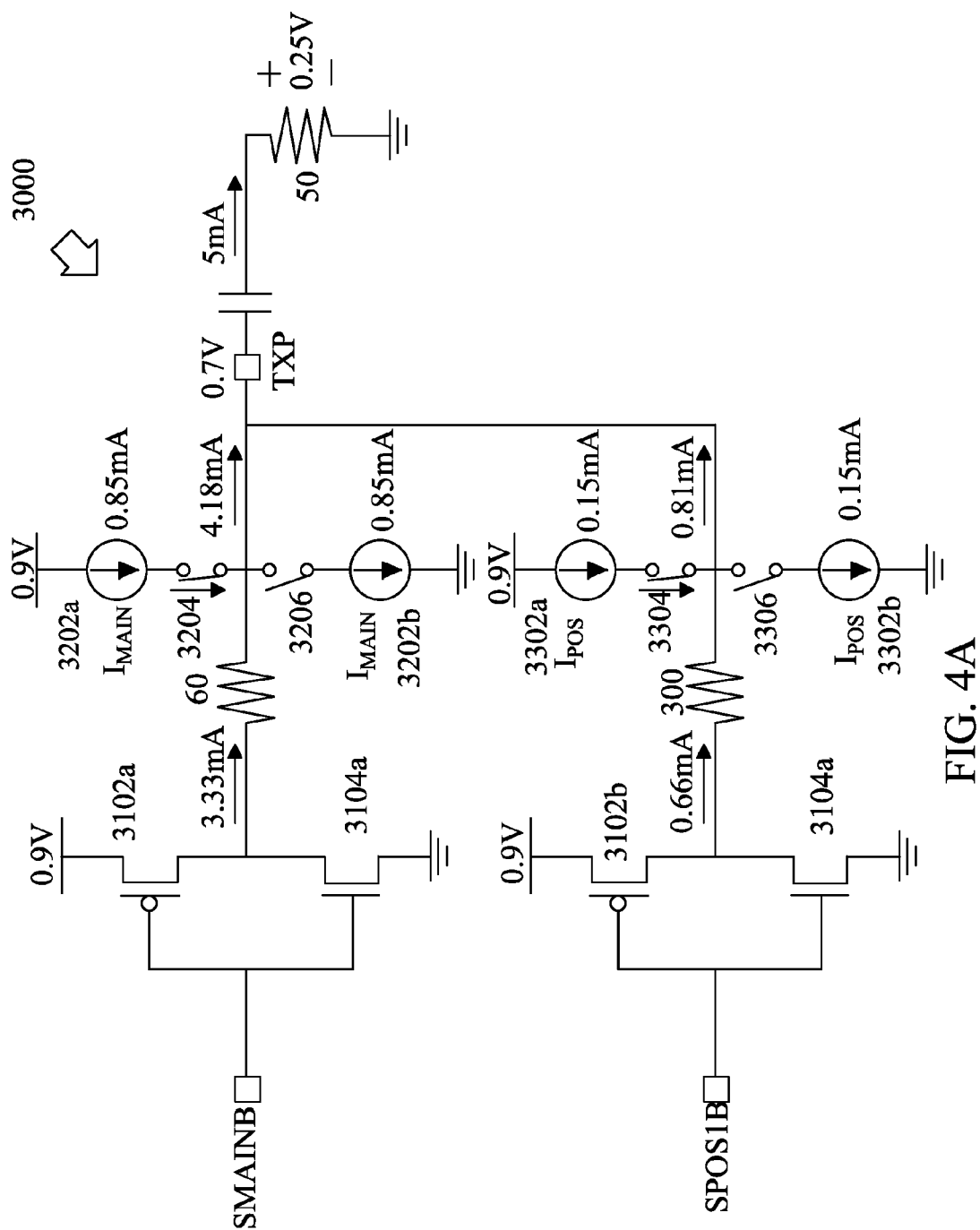
FIGS. 4A and 4B are example use scenarios of a Voltage Mode Driver with Current Booster embodiment.
Figure 4B:
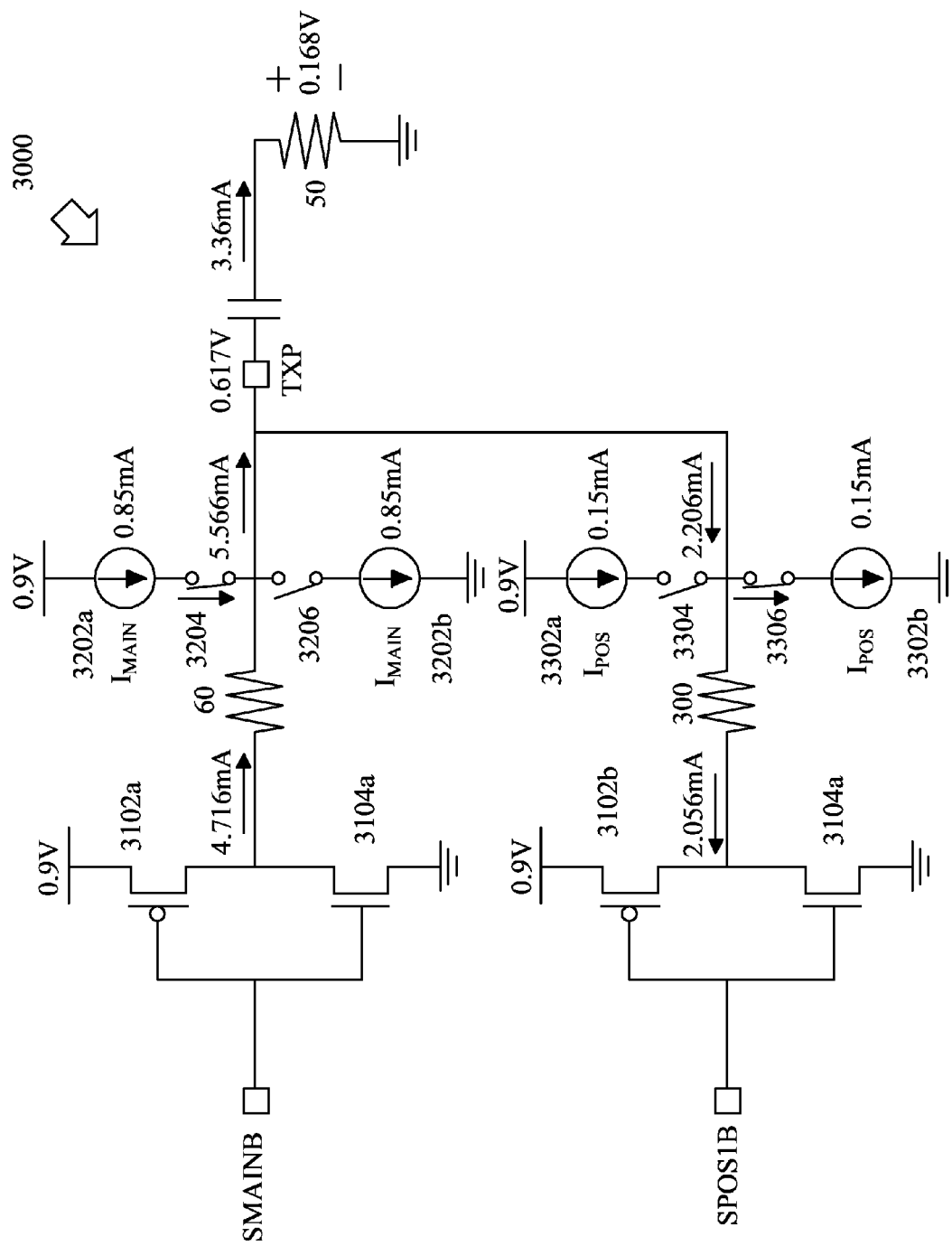

Operation of a Voltage Mode Driver with Current Booster 3000 is better understood thorough FIGS. 4A and 4B, constructed and operative in accordance with an embodiment of the current disclosure. FIGS. 4A and 4B are use scenarios of a Voltage Mode Driver with Current Booster 3000 embodiment. It is understood by those familiar with the art that the voltage supply, resistance, current supply and other values may be adjusted or changed to fit any particular application. The values of these circuit elements are used for illustrative purposes only to explain a functional operation of such an embodiment.

Turning to FIG. 4A, FIG. 4A is an example of achieving a 1 $V_{DIFFPP}$ when the supply voltage is less than 1V, constructed and operative in accordance with an embodiment of the current disclosure. In this example, power supply AVDD is 0.9V, and the receiver is modeled as a capacitor in series with a 50 ohm resistance.

To achieve a 1V peak-to-peak voltage swing, the receiver pad should produce a voltage swing of half of the voltage supply +/−0.25V. Thus, for a power supply AVDD of 0.9V, the TXP voltage would be 0.7V (0.9V/2+0.25V=0.7V).

The current from inverts 3100a and 3100b can be adjusted through setting the appropriate resistance of resistors R1 and R2. In this example, resistor R1 is 60 ohms, while R2 is 300 ohms, respectively. Current from inverter 3100a can therefore be calculated as 3.33 mA (0.9V-0.7V/60 ohms), while current from inverter 3100b is 0.66 mA (0.9V-0.7V/300 ohms).

Current sources IMAIN 3200 and IPOS 3300 are sized such that their total current output is 1 mA. In this embodiment, IMAIN 3200 is 0.85 mA, while IPOS 3300 is 0.15 mA.

The total driving current from the two inverters and power supplies is therefore 5 mA. The total driving current of 5 mA results in a 1V peak-to-peak voltage swing, even though the voltage supply is 0.9V.

In another embodiment, FIG. 4B is an example of achieving a −3.5 dB voltage level swing when the supply voltage is less than 1V, constructed and operative in accordance with an embodiment of the current disclosure. In this example, power supply AVDD is 0.9V, and the receiver is modeled as a capacitor in series with a 50 ohm resistance.

To achieve a −3.5 dB voltage level swing, the receiver pad should produce a voltage swing of half of the voltage supply +/−0.167V. Thus, for a power supply AVDD of 0.9V, the TXP voltage would be 0.617V (0.9V/2+0.167V=0.617V).

The current from inverts 3100a and 3100b can be adjusted through setting the appropriate resistance of resistors R1 and R2. Like the previous example, resistor R1 is 60 ohms, while R2 is 300 ohms, respectively. Current from inverter 3100a can therefore be calculated as 4.716 mA (0.9V-0.617V/60 ohms), while current from inverter 3100b is 2.056 mA (0.9V-0.617V/300 ohms).

Again, current sources IMAIN 3200 and IPOS 3300 are sized such that their total current output is 1 mA. In this embodiment, IMAIN 3200 is 0.85 mA, while IPOS 3300 is 0.15 mA.

The total driving current from the two inverters and power supplies is therefore 3.36 mA. The total driving current of 3.36 mA results in a −3.5 dB voltage level swing, even though the voltage supply is 0.9V.

In one embodiment, a voltage mode driver circuit comprises: a first inverter configured to receive an input at a node MAN and output at a node TXP; a second inverter configured to receive an input at a node POS and output at the node TXP; and a first current source serially coupled to the node TXP via a first switch. The first switch is configured to receive an input at the node MAIN.

In one embodiment, a voltage mode driver circuit comprises: a first p-type transistor with a first p-type gate, a first p-type source and a first p-type drain. The first p-type gate is connected to receive a first input. The first p-type source is connected to a power supply. The first p-type drain is serially coupled with an output node TXP via a first resistance. A first n-type transistor has a first n-type gate, a first n-type source and a first n-type drain. The first n-type gate is connected to receive the first input. The first n-type source is connected to ground. The first n-type drain is serially coupled with the output node TXP via a second resistance. A first current source is serially coupled between the power supply and the node TXP via a first switch. A second current source is serially coupled between ground and to the node TXP via a second switch.

In another embodiment, a method comprises: receiving a first input signal at a first input node; inverting the first input signal; outputting the inverted first input signal at a positive output node; receiving a second input signal at a second input node; inverting the second input signal; outputting the inverted second input signal at the positive output node; and providing current from a first current source to the positive output node via a first switch, wherein the first switch is configured to receive an input at the first input node.

The previous description of the embodiments is provided to enable any person skilled in the art to practice the invention. The various modifications to these embodiments will be readily apparent to those skilled in the art, and the generic principles defined herein may be applied to other embodiments without the use of inventive faculty. Thus, the current disclosure is not intended to be limited to the embodiments shown herein, but is to be accorded the widest scope consistent with the principles and novel features disclosed herein.

What is claimed is:

1. A voltage mode driver circuit comprising:
    a first inverter configured to receive an input at a node MAIN and output at a node TXP;
    a second inverter configured to receive an input at a node POS and output at the node TXP; and
    a first current source serially coupled to the node TXP via a first switch, the first switch configured to receive an input at the node MAIN, wherein a voltage output swing at the node TXP is larger than a power supply voltage applied to the voltage mode driver circuit.

2. The voltage mode driver circuit of claim 1, further comprising:
    a second current source serially coupled to the node TXP via a second switch, the second switch configured to receive an input at the node POS and wherein the power supply voltage is less than 1 volt.

3. The voltage mode driver circuit of claim 2, the first inverter further comprising:
    a first p-type transistor with a first p-type gate, a first p-type source and a first p-type drain; the first p-type gate being connected to node MAIN, the first p-type source being connected to a power supply; and
    a first n-type transistor with a first n-type gate, a first n-type source and a first n-type drain; the first n-type gate being connected to node MAIN, the first n-type source being connected to a ground, the first n-type drain being connected to the first p-type drain; and
    a first resistance, the first resistance being serially connected to the first p-type drain and the node TXP.

4. The voltage mode driver circuit of claim 3, the second inverter further comprising:
    a second p-type transistor with a second p-type gate, a second p-type source and a second p-type drain; the second p-type gate being connected to node MAIN, the second p-type source being connected to the power supply; and
    a second n-type transistor with a second n-type gate, a second n-type source and a second n-type drain; the second n-type gate being connected to node MAIN, the second n-type source being connected to a ground, the second n-type drain being connected to the p-type drain; and
    a second resistance, the second resistance being serially connected to the second p-type drain and the node TXP.

5. The voltage mode driver circuit of claim 4, wherein the first current source is also serially coupled between the node TXP and ground via a third switch.

6. The voltage mode driver circuit of claim 5, wherein the second current source is also serially coupled between the node TXP and ground via a fourth switch.

7. The voltage mode driver circuit of claim 6, wherein the first switch is a p-type transistor.

8. The voltage mode driver circuit of claim 7, wherein the second switch is a p-type transistor.

9. The voltage mode driver circuit of claim 8, wherein the third switch is an n-type transistor.

10. The voltage mode driver circuit of claim 9, wherein the fourth switch is an n-type transistor.

11. The voltage mode driver circuit of claim 10, wherein the first resistance is impedance matched with an expected receiver at the node TXP.

12. The voltage mode driver circuit of claim 11, wherein the second resistance is impedance matched with the expected receiver at the node TXP.

13. The voltage mode driver circuit of claim 12, wherein the power supply is 0.9V.

14. The voltage mode driver circuit of claim 13, wherein the first resistance is 60 ohms.

15. The voltage mode driver circuit of claim 14, wherein the second resistance is 300 ohms.

16. The voltage mode driver circuit of claim 13, wherein the first current source is 0.85 mA.

17. The voltage mode driver circuit of claim 14, wherein the second current source is 0.15 mA.

18. A voltage mode driver circuit comprising:
    a first p-type transistor with a first p-type gate, a first p-type source and a first p-type drain; the first p-type gate being connected to receive a first input; the first p-type source being connected to a power supply; the first p-type drain being serially coupled with an output node TXP via a first resistance, the output node having a voltage output swing larger than a power supply voltage applied by the power supply;
    a first n-type transistor with a first n-type gate, a first n-type source and a first n-type drain; the first n-type gate being connected to receive the first input; the first n-type source being connected to ground; the first n-type drain being serially coupled with the output node TXP via a second resistance;
    a first current source serially coupled between the power supply and the node TXP via a first switch;
    a second current source serially coupled between ground and to the node TXP via a second switch.

19. The voltage mode driver circuit of claim 18, further comprising:
- a second p-type transistor with a second p-type gate, a second p-type source and a second p-type drain; the second p-type gate being connected to receive a second input; the second p-type source being connected to the power supply; the second p-type drain being serially coupled with an output node TXN via a third resistance;
- a second n-type transistor with a second n-type gate, a second n-type source and a second n-type drain; the second n-type gate being connected to receive the second input; the second n-type source being connected to ground; the second n-type drain being serially coupled with the output node TXN via a fourth resistance;
- a third current source serially coupled between the power supply and the node TXN via a third switch; and
- a fourth current source serially coupled between ground and the node TXN via a fourth switch.

20. A method, comprising:
receiving a first input signal at a first input node;
inverting the first input signal;
outputting the inverted first input signal at a positive output node;
receiving a second input signal at a second input node;
inverting the second input signal;
outputting the inverted second input signal at the positive output node; and
providing current from a first current source to the positive output node via a first switch, wherein the first switch is configured to receive an input at the first input node and wherein a voltage output swing at the positive output node is larger than a power supply voltage applied to the first current source.

* * * * *